United States Patent
Pihlstrom

(10) Patent No.: US 6,720,803 B2
(45) Date of Patent: Apr. 13, 2004

(54) DRIVER CIRCUIT

(75) Inventor: Nathan L. Pihlstrom, Monument, CO (US)

(73) Assignee: Intel Corporation, Santa Clara, CA (US)

( * ) Notice: Subject to any disclaimer, the term of this patent is extended or adjusted under 35 U.S.C. 154(b) by 34 days.

(21) Appl. No.: 10/223,178

(22) Filed: Aug. 19, 2002

(65) Prior Publication Data

US 2004/0032287 A1 Feb. 19, 2004

(51) Int. Cl.$^7$ .............................. H03B 1/00; H03K 3/00
(52) U.S. Cl. ..................... 327/108; 327/112; 326/23; 326/27; 326/83
(58) Field of Search .................... 327/205, 379, 327/391, 108, 112; 326/82, 83, 26, 27, 23, 24

(56) References Cited

U.S. PATENT DOCUMENTS

| | | | |
|---|---|---|---|
| 4,833,349 A | * 5/1989 | Liu et al. | 326/50 |
| 5,025,181 A | * 6/1991 | Farmer | 327/404 |
| 5,355,028 A | * 10/1994 | O'Toole | 326/83 |
| 5,495,195 A | * 2/1996 | Fontana et al. | 327/108 |
| 5,751,180 A | * 5/1998 | D'Addeo | 327/379 |
| 5,760,620 A | * 6/1998 | Doluca | 327/112 |
| 6,169,421 B1 | * 1/2001 | Bryan et al. | 326/83 |
| 6,225,844 B1 | * 5/2001 | Fujiwara | 327/170 |
| 6,433,602 B1 | * 8/2002 | Lall et al. | 327/205 |
| 6,529,050 B1 | * 3/2003 | Kuo et al. | 327/112 |

* cited by examiner

Primary Examiner—Tuan T. Lam
(74) Attorney, Agent, or Firm—Trop, Pruner & Hu, P.C.

(57) ABSTRACT

A technique includes, in response to a first signal transitioning to a first logic state and first drive circuit being deactivated, activating a second drive circuit to provide a second signal. In response to the second drive circuit being deactivated and the first signal transitioning to a second logic state that is different from the first logic state, the first drive circuit is activated to provide the second signal.

17 Claims, 6 Drawing Sheets

DRIVER CIRCUIT

BACKGROUND

The invention generally relates to a driver circuit.

An output driver circuit may be used for purposes of driving a particular logic signal onto a signal line (a data line of a bus, for example). A component of such a driver is a complementary metal-oxide-semiconductor (CMOS) inverter 1 that is depicted in FIG. 1. As shown, the CMOS inverter 1 includes an n-channel metal-oxidesemiconductor field-effect-transistor (MOSFET), or "NMOSFET" 3, and a p-channel MOSFET, or "PMOSFET" 2. The source terminal of the PMOSFET 2 is coupled to a supply voltage (called "$V_{DD}$") and the drain terminals of the PMOSFET 2 and the NMOSFET 3 are connected together to form an output terminal 4 that furnishes an output signal (called "$V_{OUT}$"). The source terminal of the NMOSFET 3, in turn, is coupled to another power supply voltage (called $V_{SS}$) that is lower than the $V_{DD}$ supply voltage. The gate terminals of the PMOSFET 2 and the NMOSFET 3 are connected together to form an input node that receives an input signal called $V_{IN}$.

The CMOS inverter operates in the following manner. When the $V_{IN}$ voltage is at a logic one voltage level, the NMOSFET 3 conducts to drive the $V_{OUT}$ voltage to a logic zero level. In response to the $V_{IN}$ input voltage being at a logic zero level, the PMOSFET 2 conducts to drive the $V_{OUT}$ voltage to a logic one level. Although in the general operation of the CMOS inverter 1, one of the transistors is fully activated while the other one is fully deactivated, both transistors conduct significant current during the transition of the CMOS inverter 1 between logical states. For example, FIG. 2 depicts a drain-source current 5 of the NMOSFET 3 and a source-drain current 6 of the PMOSFET 2 during the transition of the $V_{IN}$ input voltage from a logic one state to a logic zero state. In this manner, before time $T_0$, the CMOS inverter 1 is in a steady state in which the $V_{IN}$ input voltage is at a logic one level to cause the NMOSFET 3 to conduct and the PMOSFET 2 to be deactivated, or not conduct. Thus, before time $T_0$, the NMOSFET is on but due to the non-conduction of the PMOSFET 2 has essentially no drain source current 5. However, at time $T_0$, the $V_{IN}$ input voltage transitions from the logic one level to a logic zero level. During this transition, the PMOSFET's current 6 and the NMOSFET's current 5 ramps upward to a peak 7, with both currents 5 and 6 descending downwardly to zero levels after time $T_1$. Thus, between times $T_0$ to $T_1$, both the NMOSFET 3 and the PMOSFET 2 are conducting, a state of the CMOS inverter 1 that produces the most power dissipation for the inverter 1 due to the non-zero drain-to-source voltage of the NMOSFET 3 and the non-zero source-to-drain voltage of the PMOSFET 2. The conduction of the NMOSFET 3 during the transition depicted in FIG. 2 produces what is called a crowbar current. This crowbar current increases the power dissipation of the CMOS inverter 1. A similar crowbar current is produced by the conduction of the PMOSFET 2 during the transition of the $V_{IN}$ signal from a logic one state to a logic zero state.

Therefore, output driver circuits may have crowbar currents that may cause significant power dissipation. Thus, there is a continuing need for better ways to make an output driver circuit.

DETAILED DESCRIPTION

Figure 1:
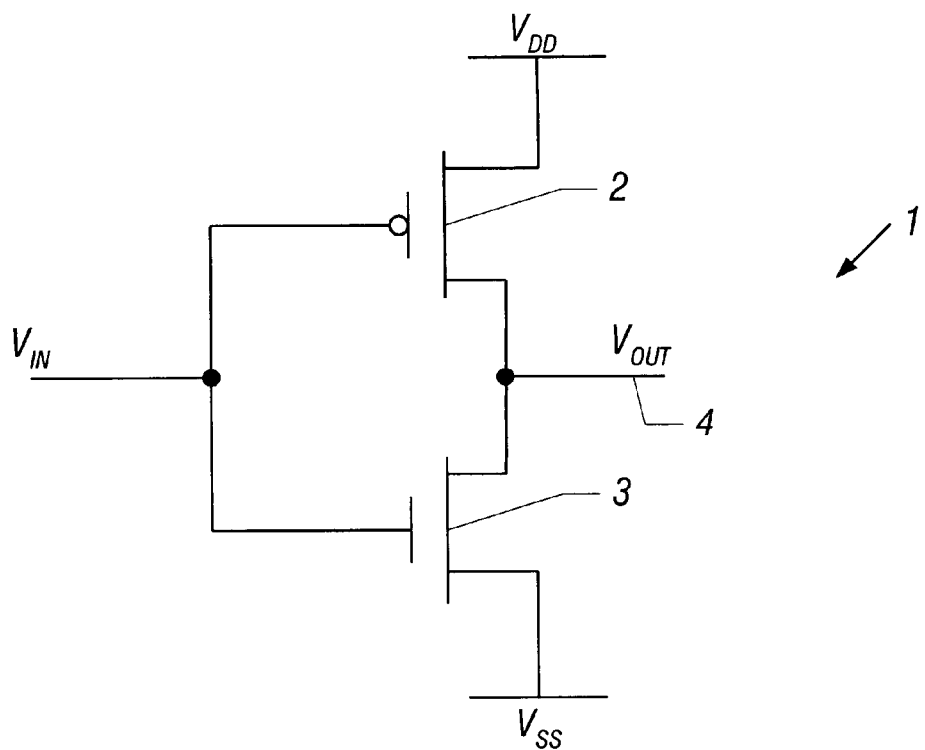
FIG. 1 is a schematic diagram of a CMOS inverter of the prior art.
Figure 2:
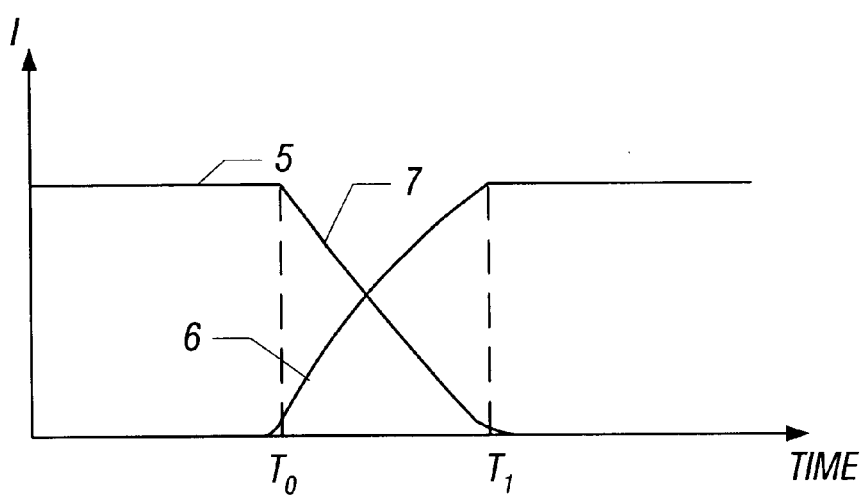
FIG. 2 depicts waveforms of the CMOS inverter of FIG. 1.
Figure 3:
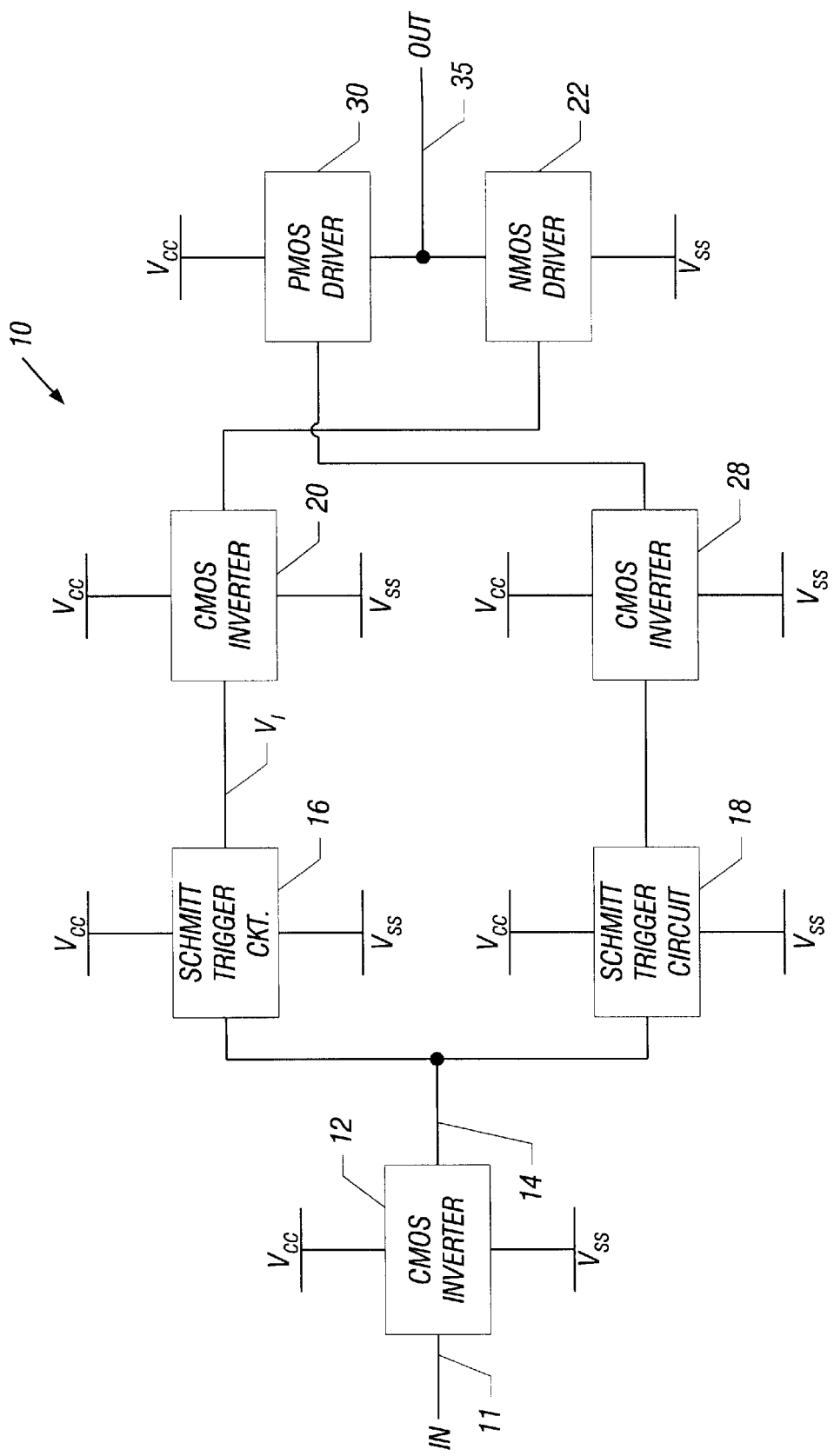
FIG. 3 is a schematic diagram of an output driver circuit according to an embodiment of the invention.

Referring to FIG. 3, an embodiment 10 of an output driver circuit, in accordance with the invention includes a p-channel metal-oxide-semiconductor (PMOS) driver 30 and an n-channel metal-oxide-semiconductor (NMOS) driver 22. The PMOS 30 and NMOS 22 drivers may be coupled to drive a logic signal (called "OUT") onto an output terminal 35 of the driver circuit 10 in accordance with the state of an input signal (called IN) that may appear on an input terminal 11 of the circuit 10. In this manner, in some embodiments of the invention, in response to the IN signal being asserted (driven high, for example) from a non-asserted state (a logic zero state, for example), the driver circuit 10 may deactivate the NMOS driver 22 and may activate the PMOS driver 30 to assert the OUT signal. Conversely, in response to the IN signal being de-asserted (driven low, for example), from an asserted state (a logic one state, for example), the driver circuit 10 deactivates the PMOS driver 30 and may activate the NMOS driver 22 to de-assert the OUT signal.

Although the PMOS 30 and NMOS 22 drivers, in general, may function the same as the corresponding devices in a CMOS inverter, the PMOS 30 and NMOS 22 drivers are connected differently, in that the control terminals (the gate terminals, for example) of the PMOS 30 at NMOS 22 drivers are not connected together. Rather, the driver circuit 10 controls the activation and deactivation of the drivers 22 and 30 to reduce the level of crowbar current appearing in the operation of the drivers 22 and 30 during the transition of the IN signal (and OUT signal) between logical states.

More particularly, in some embodiments of the invention, the driver circuit 10 deactivates the NMOS driver 22 before activating the PMOS driver 30 to assert the OUT signal. Likewise, the driver circuit 10 deactivates the PMOS driver 30 before activating the NMOS driver 22 to de-assert the OUT signal. By ensuring the deactivation of a particular driver 22, 30 before the activation of the other driver 22, 30, potential crowbar current is significantly reduced, if not eliminated.

In some embodiments of the invention, a particular driver 22, 30 is deemed to be deactivated when the driver 22, 30 is furnishing approximately no current to the output terminal 35. As an example, for the case where the PMOS driver 30 may be replaced with a PMOSFET driver to drive the output terminal 35 when the PMOS driver 30 is activated, the PMOS driver 30 may be deemed deactivated in response to the PMOSFET being either in 1. a cutoff mode of operation, a mode in which the source-to-gate voltage of the PMOSFET decreases below a threshold voltage of the PMOSFET; or 2. a saturation mode of operation, a mode in which the channel of the PMOSFET may become "pinched." In other embodiments of the invention, the PMOS driver 30 is deemed to be deactivated in response to the PMOSFET being in the cutoff mode of operation and is not deemed to be deactivated in response to the PMOSFET being in the saturation mode of operation. If the PMOSFET is not deactivated, then the PMOS driver 30 is deemed "activated."

Similarly, in some embodiments of the invention, the NMOS driver 22 may include an NMOSFET to drive the output terminal 35 to de-assert the OUT signal in response to the IN signal being de-asserted. In these embodiments, the NMOS driver 22 may be deemed to be deactivated in response to the NMOSFET being either in 1. a cutoff mode of operation, a mode in which the gate-to-source voltage of the NMOSFET decreases below a threshold voltage of the PMOSFET; or 2. a saturation mode of operation, a mode in which the channel of the NMOSFET becomes "pinched." In other embodiments of the invention, the NMOS driver 22 is deemed to be deactivated in response to the NMOSFET being in the cutoff mode of operation and is not deemed to be deactivated in response to the NMOSFET being in the saturation mode of operation. If the NMOSFET is not deactivated, then the NMOS driver 22 is deemed "activated."

For purposes of ensuring that one of the drivers 22, 30 is deactivated before the other driver 22, 30 is activated, the driver circuit 10 may include, for example, two Schmitt trigger circuits 16 and 18. Other circuits may be used in place of the Schmitt trigger circuits 16 and 18. As described below, the Schmitt trigger circuits 16 and 18 introduce hysteresis to effectively prevent one driver 22, 30 from being activated until the other driver 22, 30 is deactivated.

More specifically, in some embodiments of the invention, each Schmitt trigger circuit 16 has an input terminal that is coupled to an output terminal 14 of a CMOS inverter 12 (of the circuit 10). The output terminal 14 provides a signal (called VN) to both Schmitt trigger circuits 16 and 18. The input terminal of the CMOS inverter 12, in turn, is coupled to receive the IN signal from the input terminal 11 of the driver circuit 10. Thus, due to this arrangement, the VN signal is an inverted version of the IN signal.

As described below, the Schmitt trigger circuit 16 forms part of a circuit path to drive the NMOS driver 22, and the Schmitt trigger circuit 18 forms part of a circuit path to drive the PMOS driver 30. Each Schmitt trigger circuit 16 and 18, as well as the other devices of the driver circuit 10, are powered by a positive supply voltage ($V_{DD}$) and a negative supply voltage ($V_{SS}$). The operation of the Schmitt trigger circuits 16 and 18 is described below.

Figure 4:
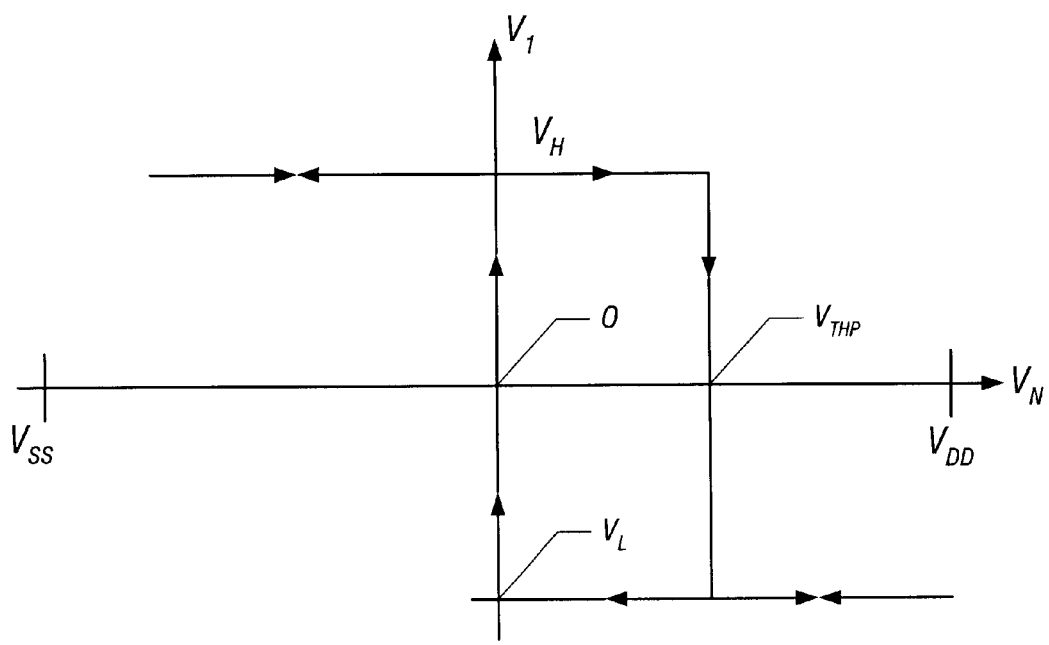
FIGS. 4 and 5 depict hysteresis waveforms of Schmitt trigger circuits of the driver circuit of FIG. 3 according to an embodiment of the invention.

Regarding the operation of the Schmitt trigger circuit 16, FIG. 4 depicts a hysteresis curve for the circuit 16. As depicted in FIG. 4, an output signal (called $V_1$) of the Schmitt trigger circuit 16 is asserted (driven high, for example) in response to the VN signal transitioning past a midpoint level (a zero volt level, for example) of the VN signal, a level between the $V_{DD}$ and $V_{SS}$ supply voltages. Although the hysteresis that is depicted in FIG. 4 shows the transition between the logic zero and logic one levels being a sharp transition, this transition may approximate a negative slope instead of the depicted vertical slope. Thus, the transition may occur slightly before the midpoint level of the VN signal and continue below the midpoint level before the logic one voltage is established. However, for purposes of simplifying the description herein, it is assumed that the $V_1$ signal transitions sharply (as shown in FIG. 4) at the midpoint level.

Similarly, the $V_1$ signal may not transition as abruptly as shown at the other depicted transition points ($V_{THP}$ and $V_{THN}$). However, for purposes of simplifying the description herein, these sharp transition are assumed, with it being understood that the transitions in the $V_1$ signal may extend slightly above and below these transition points.

The $V_1$ signal is received by the input terminal of a CMOS inverter 20 (FIG. 3) that inverts the $V_1$ signal to generate a signal that appears on the control terminal of the NMOS driver 22. Thus, in response to the VN signal transitioning past the approximate midpoint between the $V_{DD}$ and $V_{SS}$ supply voltages, the Schmitt trigger circuit 16 deactivates the NMOS driver 22.

As depicted in FIG. 4, for purposes of de-asserting the $V_1$ signal, a de-assertion that activates the NMOS driver 22, the VN signal must transition past an approximate positive threshold voltage (called "$V_{THP}$"). The effect of this threshold is that the IN input signal (which is inverted by the CMOS inverter 12 to produce the VN signal) must decrease by the magnitude of the $V_{THP}$ threshold below the midpoint level between the $V_{DD}$ and $V_{SS}$ voltages to activate the NMOS driver 22. Therefore, the NMOS driver 22 is not activated merely in response to the IN signal decreasing below the midpoint voltage level, but rather, the IN voltage must decrease significantly beyond the midpoint voltage level toward the logic zero level (i.e., come closer to the $V_{SS}$ supply voltage than to the midpoint voltage level). Due to this threshold that is introduced by the Schmitt trigger circuit 16, the PMOS driver 30 is deactivated before the NMOS driver 22 is turned on, as described below.

Figure 5:
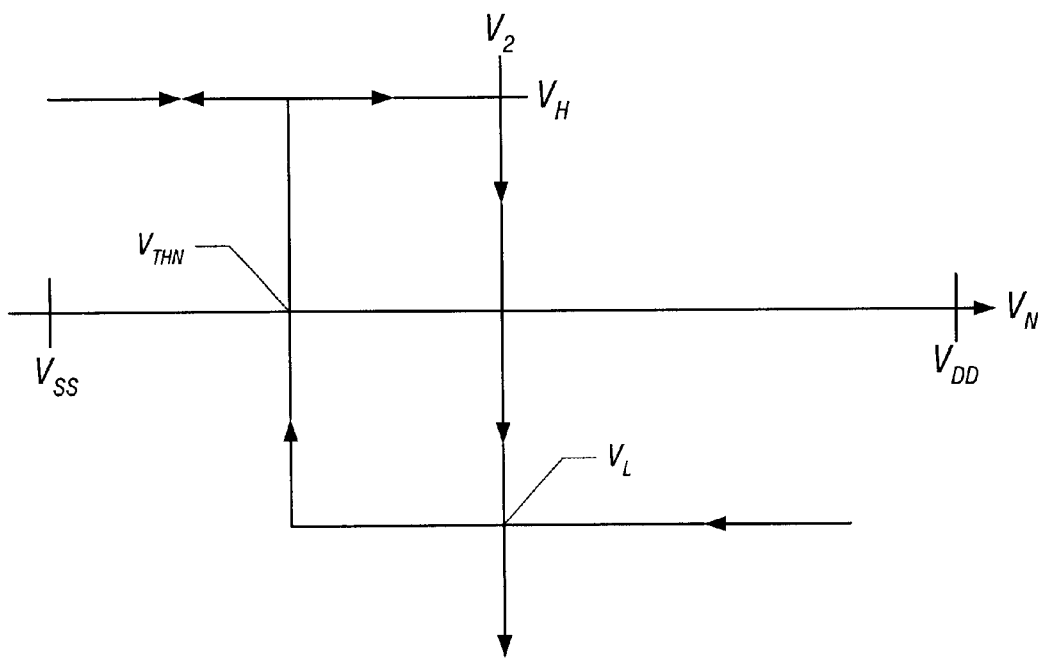

Regarding the operation of the Schmitt trigger circuit 18, the Schmitt trigger circuit 18 exhibits a hysteresis that is depicted in FIG. 5. The sharp transitions depicted in FIG. 5 are idealized for purpose, of simplicity, similar to the transitions that are depicted in FIG. 4. As shown, in response to the VN signal transitioning beyond the approximate midpoint voltage level between the $V_{DD}$ and $V_{SS}$ power supply voltages, the Schmitt trigger circuit 18 de-asserts its output signal (called $V_2$). This de-assertion of the $V_2$ signal, in turn, deactivates the PMOS driver 30. Thus, for the case where the IN signal transitions from a logic one state to a logic zero state, in response to the IN signal transition the past approximate midpoint between these states, the Schmitt trigger circuit 18 deactivates the PMOS driver 30. However, when this occurs, the Schmitt trigger circuit 16 does not activate the NMOS driver 22. Instead, the Schmitt trigger circuit 16 delays its activation, as discussed above, until the IN signal transitions past the $V_{THP}$ threshold voltage.

As depicted in FIG. 5, the Schmitt trigger circuit 18 also introduces a threshold that becomes relevant from the transition of the $V_{IN}$ signal from a logic zero level to a logic one level. In this manner, the Schmitt trigger circuit 18 does not de-assert the $V_2$ signal to activate the PMOS driver 30 in response to the VN signal being near the midpoint voltage level between the $V_{DD}$ and $V_{SS}$ supply voltages. Instead, the Schmitt trigger circuit 18 requires that the VN signal decrease to a threshold (called "$V_{THN}$") below this midpoint voltage level before activating the PMOS driver 30.

Therefore, for a logic zero to logic one transition of the IN signal, the Schmitt trigger circuit 16 deactivates the NMOS driver 22 in response to the IN signal reaching the approximate midpoint voltage level between the $V_{DD}$ and $V_{SS}$ supply voltage levels. However, at this point, the Schmitt trigger circuit 18 does not assert the $V_2$ signal to activate the PMOS driver 30. Instead, the Schmitt trigger circuit 18 establishes a threshold above the midpoint for the IN voltage to surpass before the PMOS driver 30 is activated. Thus, the NMOS driver 22 is deactivated when the PMOS driver 30 is activated.

Figure 6:
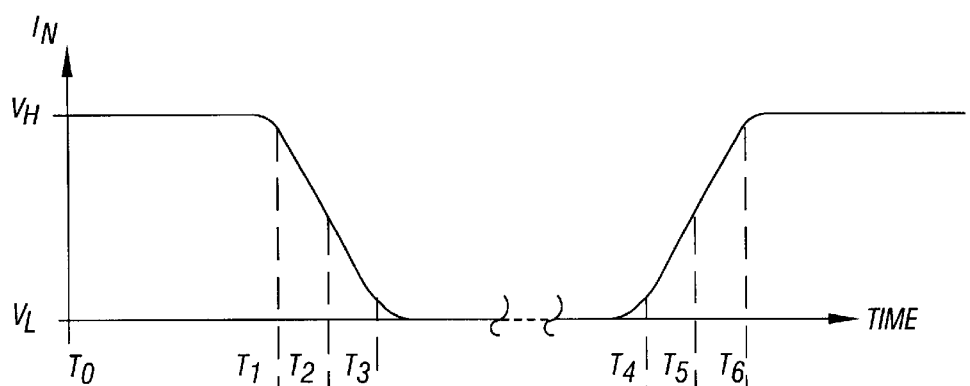
FIGS. 6, 7, 8 and 9 depict waveforms of the driver circuit of FIG. 3 according to an embodiment of the invention.
Figure 7:
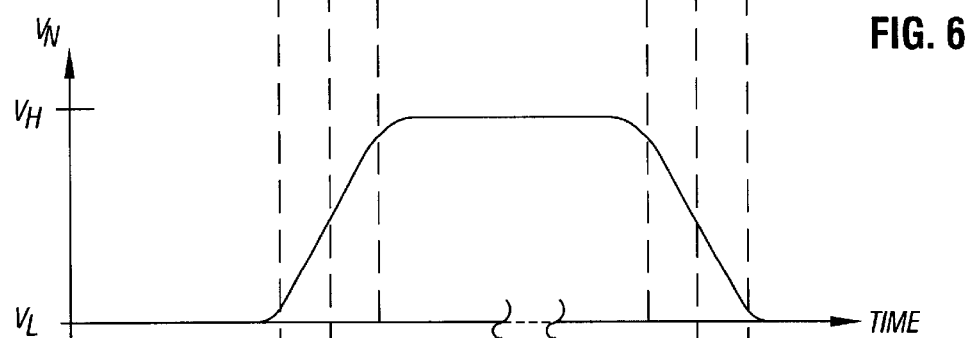
Figure 8:
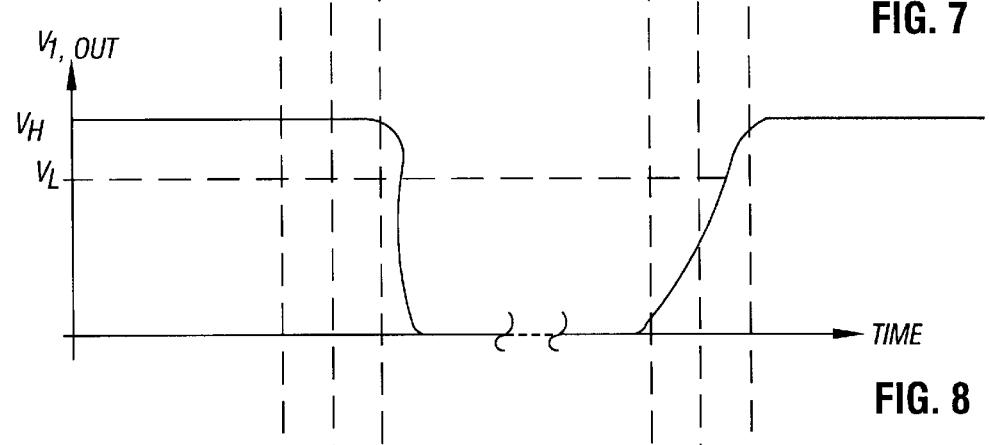
Figure 9:
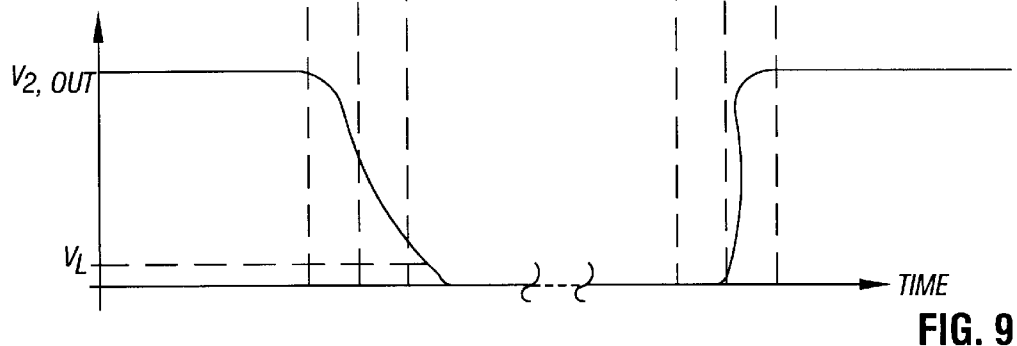

As a more specific example of the operation of the driver circuit 10 during logic transitions, FIG. 6 depicts an example in which the IN input signal transitions from a logic one state (indicated by the voltage level VH) to a logic zero state (indicated by the voltage level VL). In this manner, this transition begins at time $T_1$ and extends until about time $T_3$, the time in which the IN input signal reaches the logic zero state. The CMOS inverter 12 inverts the IN input signal to produce the corresponding VN signal that rises from time $T_1$ to about time $T_3$, as depicted in FIG. 7. As depicted in FIG. 9, at time $T_1$, the Schmitt trigger circuit 18 begins driving the $V_2$ signal low, a transition that occurs from about time $T_1$ to time $T_3$. However, as noted in FIG. 8, the Schmitt trigger circuit 16 does not begin the de-assertion of the VI signal at time $T_1$. Rather, the Schmitt trigger circuit 16, due to its introduced hysteresis, does not begin de-asserting the $V_1$ signal until about time $T_3$ or slightly after time $T_3$. Thus, due to these actions by the Schmitt trigger circuits 16 and 18, the NMOS driver 22 is not activated to de-assert the OUT signal until time $T_3$ or slightly after time $T_3$, a time after the Schmitt trigger circuit 18 has deactivated the PMOS driver 30.

FIG. 6 also depicts an example in which the IN signal transitions from a logic zero state to a logic one state. In this manner, beginning at time $T_4$ through time $T_6$ (FIG. 6), the IN signal transitions from the logic zero state to the logic one state. As depicted in FIG. 7, in response to this transition, the VN signal follows in an inverted fashion, decreasing from a logic one state to a logic zero state from time $T_4$ to time $T_6$. The Schmitt trigger circuit 16 causes the $V_1$ signal to follow the IN signal from time $T_4$ to time $T_6$. In this manner, the Schmitt trigger circuit 16 begins transitioning the $V_1$ signal from the logic zero state to a logic one state beginning at time $T_4$, and this transition is approximately complete at time $T_6$. Thus, from time $T_4$ to time $T_6$, the Schmitt trigger circuit 16 transitions the NMOS driver 22 into a deactivated state. However, the Schmitt trigger circuit 18 does not activate the PMOS driver 30 until at or slightly after time $T_6$. In this manner, referring to FIG. 9, the Schmitt trigger circuit 18 keeps the $V_2$ signal at its logic one state until at or slightly after time $T_6$, a time at which the Schmitt trigger circuit 18 begins transitioning the $V_2$ signal to the logic one state to activate the PMOS driver 30. Thus, due to the hysteresis that is introduced by the Schmitt trigger circuit 18, the PMOS driver 30 is not activated until the NMOS driver 22 is deactivated.

Figure 10:
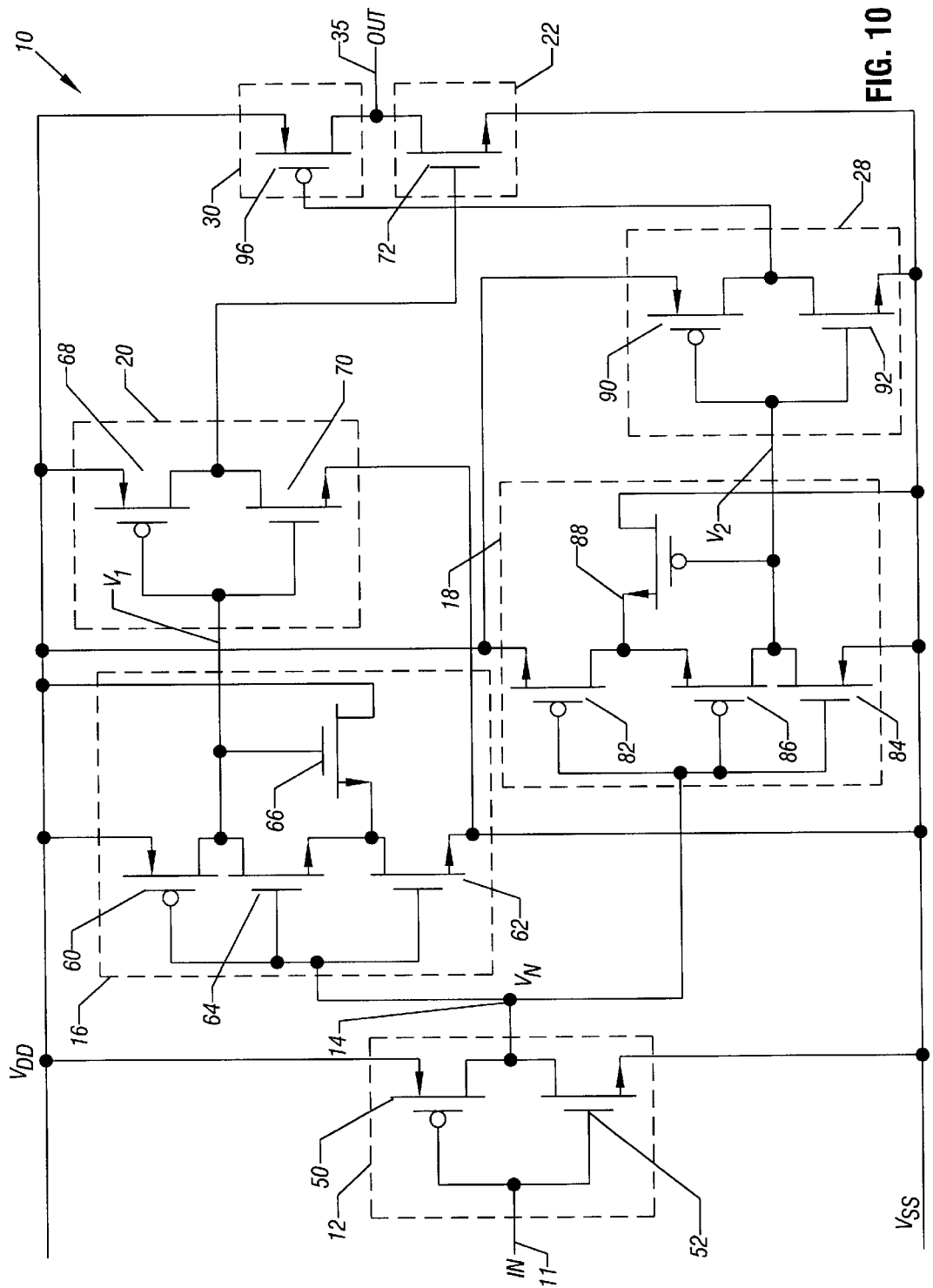
FIG. 10 is a more detailed schematic diagram of the driver circuit of FIG. 3 according to an embodiment of the invention.

In some embodiments of the invention, the driver circuit 10 has a structure similar to the circuit shown in FIG. 10. In this manner, in some embodiments of the invention, the CMOS inverter 12 may be implemented with a PMOSFET 50 that has its source terminal coupled to the $V_{DD}$ power supply level. The CMOS inverter 12 may be implemented with an NMOSFET 52 that has its source terminal coupled to the $V_{SS}$ power supply voltage. The drain terminals of the PMOSFET 50 and the NMOSFET 52 may be coupled together to form the output terminal 14 of the CMOS inverter 12. The gate terminals of the PMOSFET 50 and the NMOSFET 52 are coupled together to form the input terminal 11 of the driver circuit 10.

In some embodiments of the invention, the Schmitt trigger circuit 16 includes an NMOSFET 62 that has its source terminal coupled to the $V_{SS}$ supply voltage level. The Schmitt trigger circuit 16 also includes a PMOSFET 60 that has its source terminal coupled to the $V_{DD}$ supply voltage level. An NMOSFET 64 is interposed between the source-drain path of the PMOSFET 60 and the drain-source path of the NMOSFET 62 to introduce the VTHP offset for the Schmitt trigger circuit 16. In this manner, the drain terminal of the NMOSFET 64 is coupled to the drain terminal of the PMOSFET 60, and the source terminal of the NMOSFET 64 is coupled to the drain terminal of the NMOSFET 62. The gate terminal of the NMOSFET 64 is coupled to the output terminal 14 of the CMOS inverter 12. The Schmitt trigger 16 also includes another NMOSFET 66 that has its drain terminal coupled to the $V_{DD}$ supply voltage, and the source terminal of the NMOSFET 66 is coupled to the source terminal of the NMOSFET 64.

Due to this arrangement, the above-described transistors of the Schmitt trigger circuit 16 may establish a CMOS inverter that has a hysteresis characteristic. In this manner, in response to the VN signal decreasing and transitioning past the approximate midpoint between the $V_{DD}$ and $V_{SS}$ supply voltages, the source-drain path of the PMOSFET 60 conducts to assert (drive high, for example) the $V_1$ signal to deactivate the NMOS driver 22. However, for the case in which the VN voltage increases slightly past the midpoint voltage, the Schmitt trigger circuit 16 does not de-assert the $V_1$ signal. Instead, the NMOSFET 64 stays off as the source terminal of the NMOSFET 64 is held to a voltage near the VTHP threshold voltage by the conduction of the NMOSFET 66. Thus, when the VN signal rises to a level (i.e., a level greater than the VTHP voltage) such that the gate-to-source voltage of the NMOSFET 64 places the NMOSFET 64 into a saturation mode, the drain-source paths of the NMOSFET 64 and 62 conduct to de-assert the $V_1$ voltage level.

In some embodiments of the invention, the Schmitt trigger circuit 18 is formed from a PMOSFET 82 and an NMOSFET 84 that are generally arranged to form a modified CMOS inverter that exhibits hysteresis. More particularly, the source terminal of the PMOSFET 82 is coupled to the $V_{DD}$ supply voltage, the gate terminal of the PMOSFET 82 is coupled to the gate terminal of the NMOSFET 84, and the source terminal of the NMOSFET 84 is coupled to the $V_{SS}$ supply voltage. The gate terminals of the PMOSFET 82 and the NMOSFET 84 are coupled to the output terminal 14 of the CMOS inverter 12. The Schmitt trigger circuit 18 includes two PMOSFETs 86 and 88 that establish the hysteresis for the Schmitt trigger circuit 18. In this manner, when the VN signal transitions from a low logic level to the midpoint level between the $V_{DD}$ and $V_{SS}$ supply voltages, the NMOSFET 84 conducts to pull the $V_2$ voltage to a logic zero state.

However, when the VN voltage is at a logic one state and transitions to a logic zero state, the Schmitt trigger circuit 18 does not pull the $V_2$ logic signal high in response to the VN signal transitioning past the midpoint voltage level. Instead, the PMOSFET 88 keeps the source terminal of the PMOSFET 86 below the $V_{DD}$ supply voltage level to introduce the VTHN threshold that must be overcome for the PMOSFETs 86 and 82 to conduct to assert the $V_2$ voltage level. More particularly, the gate terminal of the PMOSFET 86 is coupled to the output terminal 14 of the CMOS inverter 12, the source terminal of the PMOSFET 86 is coupled to the drain terminal of the PMOSFET 82 and to the source terminal of the PMOSFET 88. The drain terminal of the PMOSFET 88 is coupled to the $V_{SS}$ supply voltage, and the gate terminal of the PMOSFET 88 is coupled to the drain terminal of the PMOSFET 86.

Among the other features of the driver circuit 10, in some embodiments of the invention, the CMOS inverter 20 is formed from a PMOSFET 68 that has its source terminal coupled to the $V_{DD}$ supply voltage and its drain terminal coupled to the drain terminal of an NMOSFET 70 of the CMOS inverter 20. The source terminal of the NMOSFET 70 is coupled to the $V_{SS}$ supply voltage, and the gate terminals of the PMOSFET 68 and the NMOSFET 70 are coupled together to receive the $V_1$ signal. The drain terminals of the PMOSFET 68 and the NMOSFET 70 form the signal that drives the control terminal of the NMOS driver 22.

In some embodiments of the invention, the CMOS inverter 28 includes a PMOSFET 90 that has its source terminal coupled to the $V_{DD}$ supply voltage. The drain terminal of the PMOSFET 90 is coupled to the drain terminal of a NMOSFET 92. The source terminal of the NMOSFET 92 is coupled to the $V_{SS}$ supply voltage, and the drain terminals of the PMOSFET 90 and the NMOSFET 92 are coupled together to receive the $V_2$ signal. The drain terminals of the PMOSFET 90 and the NMOSFET 92 are coupled together to form a signal that is furnished to the control terminal of the PMOS driver 30.

In some embodiments of the invention, the NMOS driver 22 includes an NMOSFET 72 that has its source terminal coupled to the $V_{SS}$ supply voltage and the drain terminal of the NMOSFET is coupled to the output terminal 35. The gate terminal of the NMOSFET 72 is coupled to the drain terminals of the PMOSFET 68 and the NMOSFET 70 of the CMOS inverter 20. In some embodiments of the invention, the PMOS driver 30 includes a PMOSFET 96 that has its source terminal coupled to the $V_{DD}$ supply voltage level. The drain terminal of the PMOSFET 96 is coupled to the output terminal 35, and the gate terminal of the PMOSFET 96 is coupled to the drain terminals of the PMOSFET 90 and the NMOSFET 92 of the CMOS inverter 28. Other variations are possible.

The driver 10 may be used in many different systems such as, for example, computers and cellular telephones, and the like. Use of the driver 10 in a cellular telephone may be quite advantageous due to the driver's ability to conserve power and extend the battery life of the cellular telephone.

Figure 11:
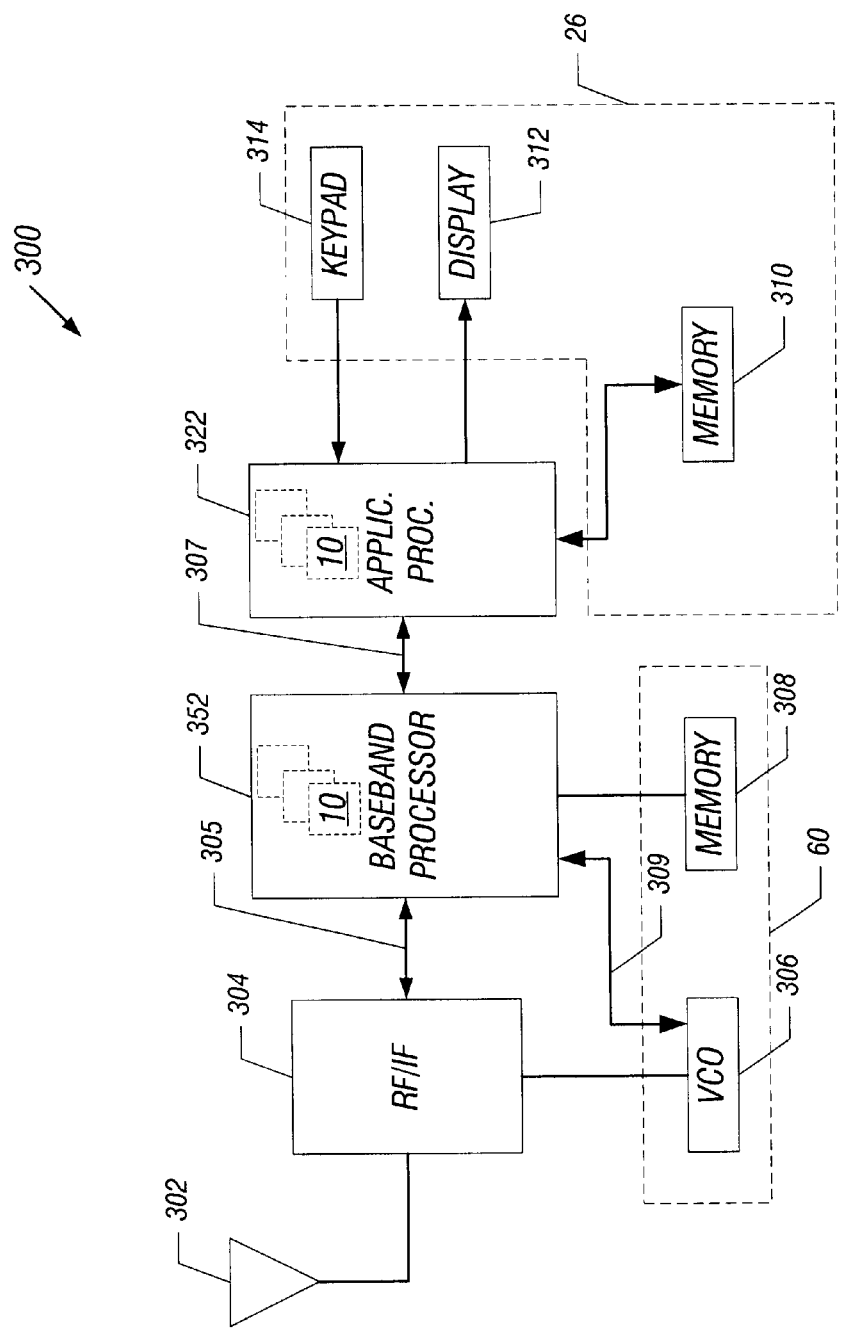
FIG. 11 is a schematic diagram of a cellular telephone in accordance with an embodiment of the invention.

FIG. 11 depicts an embodiment 300 of a cellular telephone that uses the drivers 10. In this manner, the cellular telephone 300 may include an application processor 322 that includes several drivers 10 for purposes of driving signals onto output terminals of the processor 322. Thus, the drivers 10 may be used for purposes of communicating signals between the application processor 322 and other devices of the cellular telephone 300. The cellular telephone 300 may also include a baseband processor 352 that includes several drivers 10 for purposes of driving signals onto output terminals of the processor 352. Thus, the drivers 10 may be used for purposes of communicating signals between the baseband processor 352 and other devices of the cellular telephone 300.

More specifically, the cellular telephone 300 may include an antenna 302 (a dipole antenna, for example) that is coupled to a radio frequency interface 304. The cellular telephone 300 may be in accordance with any of the available communications standards. The interface 304 may communicate with the baseband processor 352 over a bus 305. Likewise the baseband processor 352 may communicate with the application processor 322 via an interface 307.

In some embodiments of the invention, the baseband processor 352 may be coupled to and communicate (via some of the drivers 10, for example) with a memory 308 (a flash memory or a dynamic random access memory (DRAM), as examples) that stores data and possibly instructions for the baseband processor 352. The baseband processor 352 may also control a voltage controlled oscillator (VCO) 306. In this manner, the baseband processor may control the output voltage of the VCO 306 through one or more control signals 309. The application processor 322 may be coupled to and communicate (via some of the drivers 10, for example) with a memory 310 (a flash or DRAM memory, as examples) for purposes of storing data and possibly retrieving instructions that are executed by the application processor 322.

While the present invention has been described with respect to a limited number of embodiments, those skilled in the art, having the benefit of this disclosure, will appreciate numerous modifications and variations therefrom. It is intended that the appended claims cover all such modifications and variations as fall within the true spirit and scope of this present invention.

What is claimed is:

1. An apparatus comprising:
   a first drive circuit to provide a first signal in response to being activated;
   a second drive circuit to provide the first signal in response to being activated;
   a first hysteresis circuit to respond to a second signal transitioning to a first logic state and the first drive circuit being deactivated to activate the second drive circuit; and
   a second hysteresis circuit to respond to the second signal transitioning to a second logic state and the second drive circuit being deactivated to activate the first drive circuit.

2. The apparatus of claim 1, wherein the first drive circuit is deactivated in response to the second signal indicating the first logic state.

3. The apparatus of claim 2, wherein the second drive circuit is deactivated in response to the second signal indicating the second logic state.

4. The apparatus of claim 1, wherein the first drive circuit comprises a transistor.

5. The apparatus of claim 1, wherein the operations of the first and second drive circuits are combined to form an inverter.

6. The apparatus of claim 1, wherein the second hysteresis circuit initiates the activation of the first drive circuit in response to the second signal reaching a predetermined level indicating that the second drive circuit is deactivated.

7. The apparatus of claim 6, wherein the second hysteresis circuit initiates the activation of the second drive circuit in response to the second signal reaching a predetermined level indicating that the first drive circuit is deactivated.

8. An apparatus comprising:
   a NMOS transistor to provide a first signal in response to being activated;
   a PMOS transistor to provide the first signal in response to being activated;
   a first hysteresis circuit to respond to a second signal transitioning to a first logic state and the NMOS transistor being deactivated to activate the PMOS transistor; and
   a second hysteresis circuit to respond to the second signal transitioning to a second logic state and the PMOS transistor being deactivated to activate the NMOS transistor.

9. The apparatus of claim 8, wherein the NMOS transistor is deactivated in response to the second signal indicating the first logic state.

10. The apparatus of claim 9, wherein the PMOS transistor is deactivated in response to the second signal indicating the second logic state.

11. The apparatus of claim 8, wherein the operations of the NMOS and PMOS transistors are combined to form an inverter.

12. The apparatus of claim 8, wherein the second hysteresis circuit initiates the activation of the NMOS transistor in response to the second signal reaching a predetermined level indicating that the PMOS transistor is deactivated.

13. The apparatus of claim 12, wherein the second hysteresis circuit initiates the activation of the PMOS transistor in response to the second signal reaching a predetermined level indicating that the NMOS transistor is deactivated.

14. An apparatus comprising:

a flash memory;

a first drive circuit coupled to the flash memory to provide a first signal in response to being activated;

a second drive circuit coupled to the flash memory to provide the first signal in response to being activated;

a first hysteresis circuit to respond to a second signal transitioning to a first logic state and the first drive circuit being deactivated to activate the second drive circuit; and a second hysteresis circuit to respond to the second signal transitioning to a second logic state and the second drive circuit being deactivated to activate the first drive circuit.

15. The apparatus of claim 14, wherein the first drive circuit is deactivated in response to the second signal indicating the first logic state.

16. The apparatus of claim 14, wherein the second drive circuit is deactivated in response to the second signal indicating the second logic state.

17. The apparatus of claim 14, wherein the system comprises a cellular telephone.

\* \* \* \* \*